(12) United States Patent
Nowak et al.

(10) Patent No.: US 8,577,945 B2
(45) Date of Patent: Nov. 5, 2013

(54) METHOD AND APPARATUS OF ADAPTIVELY CANCELING A FUNDAMENTAL FREQUENCY OF AN ANALOG SIGNAL

(75) Inventors: Michael P. Nowak, Milwaukee, WI (US); Steven A. Dimino, Wauwatosa, WI (US)

(73) Assignee: Eaton Corporation, Cleveland, OH (US)

( * ) Notice: Subject to any disclaimer, the term of this patent is extended or adjusted under 35 U.S.C. 154(b) by 630 days.

(21) Appl. No.: 12/834,105

(22) Filed: Jul. 12, 2010

(65) Prior Publication Data

US 2012/0011183 A1 Jan. 12, 2012

(51) Int. Cl.
*G06F 17/10* (2006.01)
(52) U.S. Cl.
USPC ........................................... 708/322
(58) Field of Classification Search
USPC ........................................... 708/322
See application file for complete search history.

(56) References Cited

U.S. PATENT DOCUMENTS

| | | | | | |
|---|---|---|---|---|---|
| 4,349,889 | A | * | 9/1982 | van den Elzen et al. | 708/322 |
| 5,869,945 | A | * | 2/1999 | Ha et al. | 318/600 |
| 5,956,373 | A | * | 9/1999 | Goldston et al. | 375/298 |
| 6,980,609 | B1 | * | 12/2005 | Ahn | 375/343 |
| 7,397,212 | B2 | * | 7/2008 | Turner | 318/561 |
| 2003/0155922 | A1 | * | 8/2003 | Royle et al. | 324/326 |

FOREIGN PATENT DOCUMENTS

JP 8033318 A 2/1996

OTHER PUBLICATIONS

Integrated Circuits—PCF8591—8-bit A/D and D/A converter, Jan. 27, 2003, Philips Semiconductors, 1-28.*
Widrow, B. et al., "Adaptive Signal Processing", ISBN 0-13-004029-0, 1985, pp. 15-20 and 99-103.
Proakis, John G. et al., "Digital Signal Processing—Principles, Algorithms, and Applications", Third Edition, Prentice Hall, Inc., 1996, 29 pp. (i, ii; 748-74).
Haykin, Simon, "Adaptive Filter Theory", Third Edition, Prentice Hall, Inc., 1996, 11 pp. (i, ii and 377-85).

* cited by examiner

*Primary Examiner* — Chat Do
*Assistant Examiner* — Kevin G Hughes
(74) *Attorney, Agent, or Firm* — Eckert Seamans Cherin & Mellott, LLC; Kirk D. Houser

(57) ABSTRACT

A system includes a first powered apparatus having a first analog signal with a fundamental frequency; and a second apparatus providing load diagnostics or power quality assessment of the first apparatus from a second digital signal. The second apparatus includes an input of the first analog signal, an output of the second digital signal, a processor, an adaptive filter executed by the processor, a digital-to-analog converter, and an analog-to-digital converter. The adaptive filter routine outputs a third digital signal as a function of the second digital signal and plural adaptive weights. The digital-to-analog converter inputs the third digital signal and outputs a fourth analog signal representative of an estimate of a fundamental frequency component of the first analog signal. The analog-to-digital converter inputs a difference between the first and fourth analog signals, and outputs the second digital signal representative of the first analog signal with the fundamental frequency component removed.

8 Claims, 2 Drawing Sheets

METHOD AND APPARATUS OF ADAPTIVELY CANCELING A FUNDAMENTAL FREQUENCY OF AN ANALOG SIGNAL

BACKGROUND

1. Field

The disclosed concept pertains generally to filters and, more particularly, to filters for removing a fundamental frequency from an analog signal, such as, for example, a motor current. The disclosed concept also pertains to methods of removing a fundamental frequency from an analog signal. The disclosed concept further pertains to systems for removing a fundamental frequency from an analog signal.

2. Background Information

In many situations, current components indicative of system faults are of a much smaller magnitude than the magnitude of a line frequency component. When implemented on low-cost digital signal processors, the performance of fault detection algorithms is significantly impaired by the loss of resolution of such current components after the analog-to-digital conversion (ADC) process. This problem can be alleviated by removing the line frequency component prior to ADC and by utilizing the full dynamic range of the ADC for the current components indicative of system faults. Known conventional techniques involving the removal of sinusoidal components often utilize notch filters set at the particular frequency of interest. However, these notch filters, in addition to canceling the desired frequency component, often remove or attenuate signal components of interest that are sufficiently close to the desired frequency. This is primarily due to the fact that the supply frequency from the utility can vary from the nominal value (e.g., without limitation, 50 Hz; 60 Hz). The conventional filters also cannot be used in applications where variable frequency motor drives are employed.

There is room for improvement in filters for removing a fundamental frequency from an analog signal.

There is also room for improvement in methods of removing a fundamental frequency from an analog signal.

There is further room for improvement in systems for removing a fundamental frequency from an analog signal.

SUMMARY

These needs and others are met by embodiments of the disclosed concept, which provide a high-resolution, fundamental frequency cancellation apparatus and method.

In accordance with one aspect of the disclosed concept, a system comprises: a first powered apparatus including a first analog signal having a fundamental frequency; and a second apparatus structured to provide load diagnostics or power quality assessment of the first powered apparatus from a second digital signal, the second apparatus comprising: an input structured to input the first analog signal, an output structured to output the second digital signal, a processor, an adaptive filter routine executed by the processor, a digital-to-analog converter comprising an input and an output, and an analog-to-digital converter comprising an input and an output, wherein the adaptive filter routine is structured to output a third digital signal as a function of the second digital signal and a plurality of adaptive weights, wherein the digital-to-analog converter is structured to input the third digital signal and output a fourth analog signal representative of an estimate of a fundamental frequency component of the first analog signal, and wherein the analog-to-digital converter is structured to input a fifth analog signal, which is a difference between the first analog signal and the fourth analog signal, and output the second digital signal representative of the first analog signal with the fundamental frequency component removed.

The second apparatus may be a fundamental frequency cancellation apparatus; and the adaptive filter routine may be structured to cancel the fundamental frequency from the first analog signal without corrupting spectral content proximate the fundamental frequency.

The first powered apparatus may be a motor; the fundamental frequency may be a line frequency; and the first analog signal may be supply current to the motor.

The first powered apparatus may receive power; the fundamental frequency may be a line frequency; the first analog signal may be supply current to the first powered apparatus; and the second apparatus may be a power sensing apparatus structured to sense power from the supply current to the first powered apparatus.

The function may be a gain value times a difference between the first analog signal and the fourth analog signal.

As another aspect of the disclosed concept, a method of canceling a fundamental frequency from an analog signal comprises: inputting a first analog signal from a powered apparatus; outputting a second digital signal; employing a digital-to-analog converter comprising an input and an output; employing an analog-to-digital converter comprising an input and an output; outputting a third digital signal from an adaptive filter as a function of the second digital signal and a plurality of adaptive weights; inputting the third digital signal to and outputting a fourth analog signal representative of an estimate of a fundamental frequency component of the first analog signal from the digital-to-analog converter; inputting a fifth analog signal to the analog-to-digital converter and outputting from the analog-to-digital converter the second digital signal representative of the first analog signal with the fundamental frequency component removed; providing the fifth analog signal as a function of a difference between the first analog signal and the fourth analog signal; and providing load diagnostics or power quality assessment of the powered apparatus from the second digital signal.

As another aspect of the disclosed concept, a system comprises: a first apparatus including a first analog signal having a fundamental frequency; and a second apparatus comprising: an input structured to input the first analog signal, an output structured to output a second digital signal, a processor, a routine executed by the processor, a digital-to-analog converter (DAC) comprising an input, an output and a delay between the input and the output of the digital-to-analog converter, and an analog-to-digital converter (ADC) comprising an input, an output and a delay between the input and the output of the analog-to-digital converter, wherein the digital-to-analog converter is structured to input a third digital signal and output a fourth analog signal representative of an estimate of a fundamental frequency component of the first analog signal, wherein the analog-to-digital converter is structured to input a fifth analog signal and output the second digital signal representative of the first analog signal with the fundamental frequency component removed, wherein the routine is structured to provide the third digital signal being $y(n)=w_s(n)*\sin(\omega_o n)+w_c(n)*\cos(\omega_o n)$, wherein the routine is further structured to provide a first adaptive weight being $w_s(n)=w_s(n-1)+\mu_c I_F(n-1)x_s(n-\Delta-1)$, wherein the routine is further structured to provide a second adaptive weight being $w_c(n)=w_c(n-1)+\mu_c I_F(n-1)x_c(n-\Delta-1)$, wherein $\omega_o$ is frequency of the fundamental frequency component, wherein n is an integer representative of a sample number, wherein $\mu_c$ is a positive constant, wherein $I_F(n-1)$ is the second digital signal for the sample number represented by n−1, wherein $x_s(n-\Delta-1)=\sin$ ($\omega_o(n-\Delta-1)$), wherein $x_c(n-\Delta-1)=\cos(\omega_o(n-\Delta-1))$, wherein $\Delta$ is a sum of the delay of the analog-to-digital converter and the delay of the digital-to-analog converter, and wherein the routine is further structured to provide the fifth analog signal being a function of a difference between the first analog signal and the fourth analog signal.

As another aspect of the disclosed concept, a fundamental frequency cancellation filter comprises: a processor comprising: an input structured to input a first analog signal, an output structured to output a second digital signal, a routine, a digital-to-analog converter comprising an input, an output and a delay between the input and the output of the digital-to-analog converter, and an analog-to-digital converter comprising an input, an output and a delay between the input and the output of the analog-to-digital converter, the digital-to-analog converter is structured to input a third digital signal and output a fourth analog signal representative of an estimate of a fundamental frequency component of the first analog signal, wherein the analog-to-digital converter is structured to input a fifth analog signal and output the second digital signal representative of the first analog signal with the fundamental frequency component removed, wherein the routine is structured to provide the third digital signal being $y(n)=w_s(n)*\sin(\omega_o n)+w_c(n)*\cos(\omega_o n)$, wherein the routine is further structured to provide a first adaptive weight being $w_s(n)=w_s(n-1)+\mu_c I_F(n-1)x_s(n-\Delta-1)$, wherein the routine is further structured to provide a second adaptive weight being $w_c(n)=w_c(n-1)+\mu_c I_F(n-1)x_c(n-\Delta-1)$, wherein $\omega_o$ is frequency of the fundamental frequency component, wherein n is an integer representative of a sample number, wherein $\mu_c$ is a positive constant, wherein $I_F(n-1)$ is the second digital signal for the sample number represented by n−1, wherein $x_s(n-\Delta-1)=\sin(\omega_o(n-\Delta-1))$, wherein $x_c(n-\Delta-1)=\cos(\omega_o(n-\Delta-1))$, wherein $\Delta$ is a sum of the delay of the analog-to-digital converter and the delay of the digital-to-analog converter, and wherein the routine is further structured to provide the fifth analog signal being a function of a difference between the first analog signal and the fourth analog signal.

The routine may be further structured to scale $x_s(n)$ by the first adaptive weight and to scale $x_c(n)$ by the second adaptive weight to provide the third digital signal.

As another aspect of the disclosed concept, a method cancels a fundamental frequency from an analog signal. The method comprises: inputting a first analog signal; outputting a second digital signal; employing a digital-to-analog converter comprising an input and an output; employing an analog-to-digital converter comprising an input and an output; inputting a third digital signal to and outputting a fourth analog signal representative of an estimate of a fundamental frequency component of the first analog signal from the digital-to-analog converter; inputting a fifth analog signal to the analog-to-digital converter and outputting from the analog-to-digital converter the second digital signal representative of the first analog signal with the fundamental frequency component removed; providing a first adaptive filter weight, $w_s(n)$, and a second adaptive filter weight, $w_c(n)$; providing a first digital sine signal, $x_s(n)=\sin(\omega_o n)$, and a second digital cosine signal, $x_c(n)=\cos(\omega_o n)$; providing the third digital signal being $y(n)=w_s(n)*\sin(\omega_o n)+w_c(n)*\cos(\omega_o n)$; employing $\omega_o$ as frequency of the fundamental frequency component; employing n as an integer representative of a sample number; and providing the fifth analog signal as a function of a difference between the first analog signal and the fourth analog signal.

The method may further comprise providing an optimum value of the first adaptive filter weight as being $w_s*=(A/G_{DAC}(\omega_o))\cos(\theta_A-\theta_{DAC}(\omega_o))$; providing an optimum value of the second adaptive filter weight as being $w_c*=(A/G_{DAC}(\omega_o))\sin(\theta_A-\theta_{DAC}(\omega_o))$; employing $A=G_{DAC}(\omega_o)\sqrt{[(w_c*)^2+(w_s*)^2]}$; employing $\theta_A=\tan^{-1}(w_c*/w_s*)+\theta_{DAC}(\omega_o)$; employing $G_{DAC}(\omega_o)$ as magnitude of a transfer function of the digital-to-analog converter at the frequency of the fundamental frequency component; and employing $\theta_{DAC}(\omega_o)$ as phase of the transfer function of the digital-to-analog converter at the frequency of the fundamental frequency component.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a digital signal processor (DSP); a microprocessor; a microcontroller; a microcomputer; a central processing unit; a mainframe computer; a mini-computer; a server; a networked processor; or any suitable processing device or apparatus.

The disclosed concept is described in association with an adaptive filter implemented by a digital signal processor (DSP) to remove a line frequency of a line current from a motor supply current of a motor, although the disclosed concept is applicable to a wide range of processors to remove a fundamental frequency of an analog signal of a wide range of apparatus.

Figure 1:
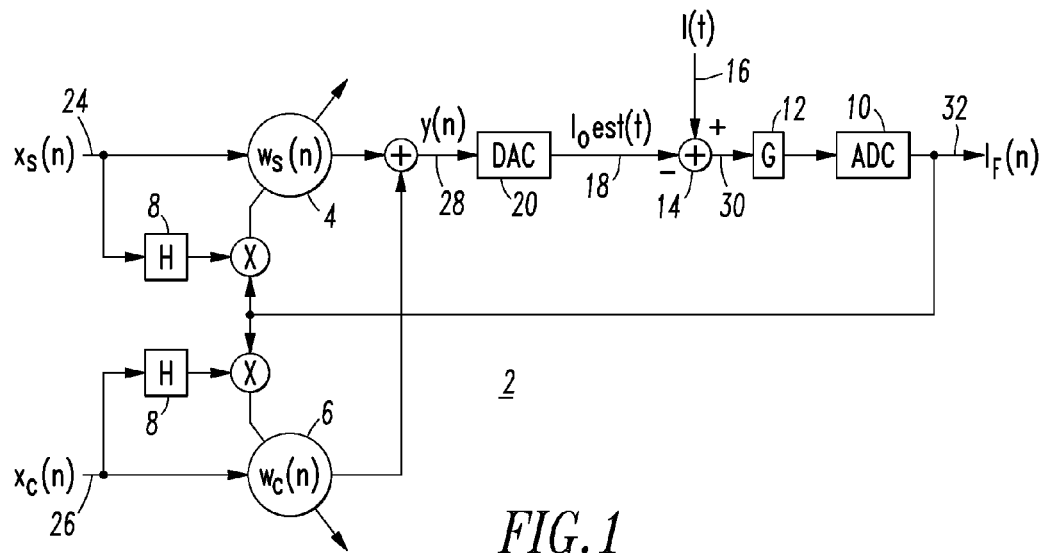
FIG. 1 is a block diagram of a fundamental frequency cancellation filter in accordance with embodiments of the disclosed concept.

Referring to FIG. 1, the cancellation of a fundamental frequency, $\omega_o$, can be achieved through the use of an adaptive filter 2 comprising two adaptive weights 4,6. H 8 is an estimate (in the digital domain) of an unknown analog domain transfer function, $H_s$ (not shown). The $H_s$ analog domain transfer function can be considered to exist between an analog-to-digital converter (ADC) 10 and an optional gain function (G) 12. The optional gain function (G) 12 can be disposed after a difference 14 between analog signal I(t) 16 and analog signal $I_c$est(t) 18. Here, t is the time portion of an analog signal. Analog signal I(t) 16 represents, for example and without limitation, analog motor supply current. A digital-to-analog converter (DAC) 20 and the ADC 10 represent respective digital-to-analog conversion and analog-to-digital conversion processes on a suitable processor, such as the example digital signal processor (DSP) 22 of FIG. 3. The adaptive filter weights are $w_s(n)$ 4 and $w_c(n)$ 6, where n is a sample number of a digital domain signal or value. The two inputs to the filter, signal $x_s(n)$ 24 and signal $x_c(n)$ 26, are respective digital sine and digital cosine signals with a frequency equal to the fundamental frequency of analog signal I(t) 16, $\omega_o$, given by $x_s(n)=\sin(\omega_o n)$ and $x_c(n)=\cos(\omega_o n)$, respectively.

Figure 3:
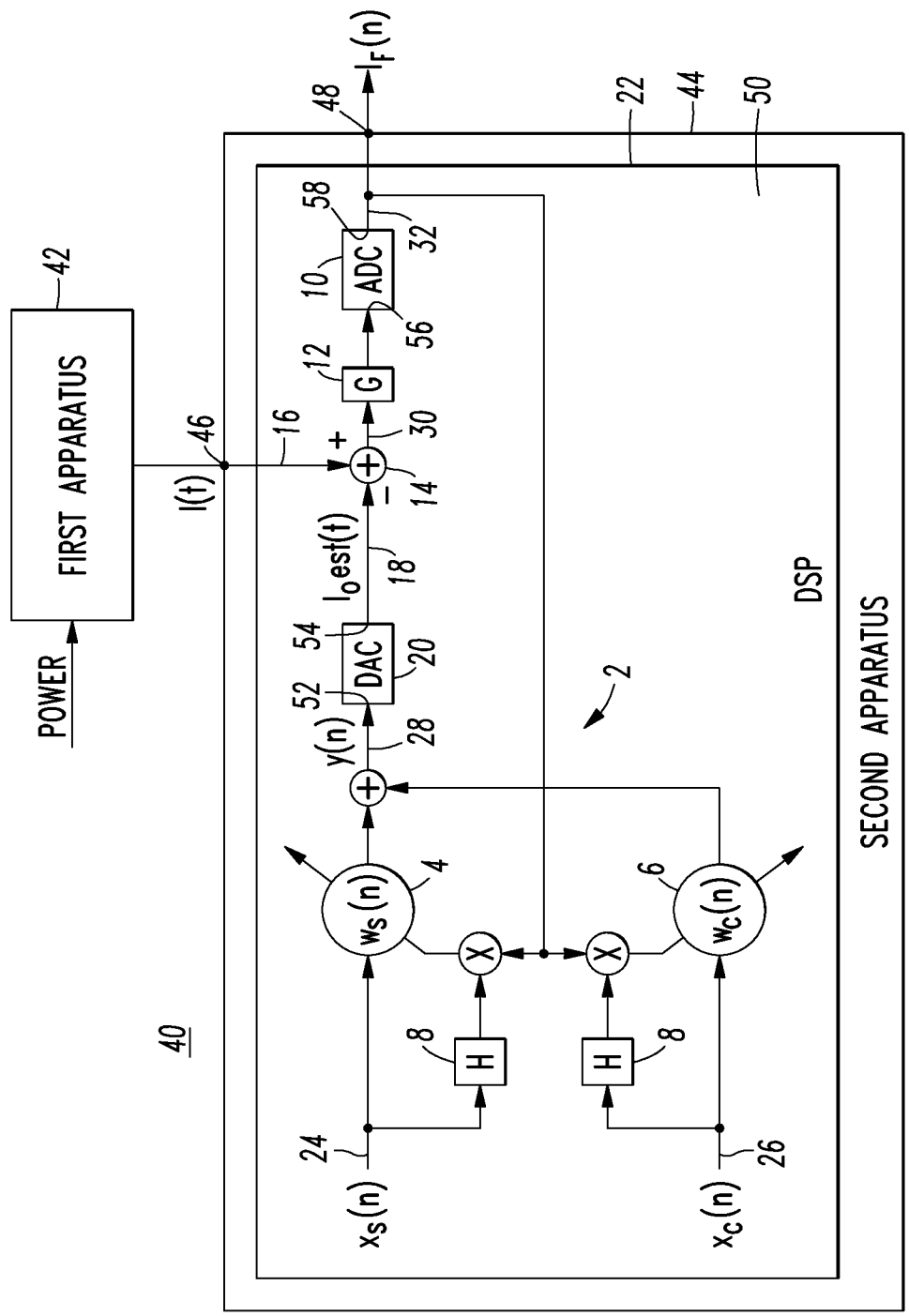
FIG. 3 is a block diagram in schematic form of a system including the fundamental frequency cancellation filter of FIG. 1.

The noise-free sinusoidal signals 24,26 are typically unavailable and can be generated on the example DSP 22 (FIG. 3). These signals 24,26 can be efficiently computed using a conventional coupled-form digital oscillator (not shown) based on an estimate of the fundamental frequency (or by using a look-up table (not shown) or by any other suitable method). The digital oscillator can be implemented using a pair of recursive equations:

$$x_s(n)=[\sin(\omega_o)]x_c(n-1)+[\cos(\omega_o)]x_s(n-1),$$

and $$x_c(n)=[\cos(\omega_o)]x_c(n-1)-[\sin(\omega_o)]x_s(n-1).$$

The recursive generation employs the initial conditions:

$$x_s(-1)=-\sin(\omega_o),$$

and $$x_c(-1)=\cos(\omega_o).$$

The basic operation of the adaptive filter 2 is as follows. The inputs 24,26 are scaled by the respective adaptive weights 4,6 and are combined to form the signal y(n) 28 as shown by Equation 1.

$$y(n)=w_s(n)*\sin(\omega_o n)+w_c(n)*\cos(\omega_o n) \quad \text{(Eq. 1)}$$

The signal y(n) 28 is converted by the DAC 20 providing the analog signal, $I_o\text{est}(t)$ 18, that is an estimate of the fundamental frequency component of analog signal I(t) 16, which can be, for example and without limitation, a motor supply current. The estimate $I_o\text{est}(t)$ 18 is subtracted from the analog signal I(t) 16 to produce an example current signal 30 with the fundamental frequency component removed. This example current signal 30, which can be amplified by the gain function (G) 12, is digitized by the ADC 10 to produce a digital output signal $I_F(n)$ 32, and which can be further processed by the DSP 22 (FIG. 3) for fault detection purposes. For example, the digital output signal $I_F(n)$ 32 can also be employed as an error or correction signal to adapt the filter weights 4,6.

The cancellation of the fundamental frequency component occurs when the filter weights 4,6 are set such that the filter output, y(n) 28, consists of a sinusoid with magnitude and phase exactly equal to magnitude and phase of the fundamental frequency component of analog signal I(t) 16. The weight values resulting in optimal cancellation are derived as follows. The fundamental frequency component, $I_o(t)$, of the example analog signal I(t) 16 is defined by Equation 2.

$$I_o(t)=A\sin(\omega_o t+\theta_A) \quad \text{(Eq. 2)}$$

wherein:
A is a constant;
$\theta_A$ is phase.

Using Equation 1, the estimated fundamental frequency component $I_o\text{est}(t)$ 18 is given by Equation 2.

$$I_o\text{est}(t)=G_{DAC}(\omega_o)w_s(t)\sin(\omega_o t+\theta_{DAC}(\omega_o))+G_{DAC}(\omega_o)w_c(t)\cos(\omega_o t+\theta_{DAC}(\omega_o)) \quad \text{(Eq. 3)}$$

wherein:
$G_{DAC}(\omega_o)$ and $\theta_{DAC}(\omega_o)$ are the respective magnitude and phase of the DAC transfer function at frequency, $\omega=\omega_o$,
$w_s(t)$ is the time domain equivalent of the digital domain adaptive weight $w_s(n)$ 4, and
$w_c(t)$ is the time domain equivalent of the digital domain adaptive weight $w_c(n)$ 6.

In Equations 1 and 3, the optimum weight values are adjusted to their optimum values using a filtered least-mean-square (Filtered-X LMS as is defined, below, after Equation 5) algorithm, and simplified in some of the following equations. In a typical setup, the input to the LMS algorithm (Equations 4A and 4B, below) is labeled 'x' and "filtered-x" refers to the fact that you need to filter the input, or 'x', before using it to update the adaptive weights. In Equations 2 and 3, the discrete time index, n, is replaced by the continuous time variable, t, since these components are after the DAC 20 and, therefore, are analog signals.

If the fundamental frequency component $I_o(t)$ of the example supply current is represented in the equivalent form:

$$I_o(t)=A\sin([\omega_o t+\theta_{DAC}(\omega_o)]+[\theta_A-\theta_{DAC}(\omega_o)]),$$

then by using trigonometric identities it can be expressed as:

$$I_o(t)=A\cos(\theta_A-\theta_{DAC}(\omega_o))\sin(\omega_o t+\theta_{DAC}(\omega_o))+A\sin(\theta_A-\theta_{DAC}(\omega_o))\cos(\omega_o t+\theta_{DAC}(\omega_o)).$$

Therefore, applying Equation 3, the optimum weight values resulting in cancellation of the fundamental frequency component $I_o(t)$ are:

$$w_s^*=(A/G_{DAC}(\omega_o))\cos(\theta_A-\theta_{DAC}(\omega_o)),$$

and $$w_c^*=(A/G_{DAC}(\omega_o))\sin(\theta_A-\theta_{DAC}(\omega_o)).$$

The magnitude and phase can be represented directly in terms of the filter weights 4,6 by:

$$A=G_{DAC}(\omega_o)\sqrt{[(w_c^*)^2+(w_s^*)^2]},$$

and $$\theta_A=\tan^{-1}(w_c^*/w_s^*)+\theta_{DAC}(\omega_o).$$

Since the magnitude and phase of $I_o(t)$ are not known and may vary over time, the filter weights 4,6 can be adapted according to a conventional least-mean-square (LMS) algorithm. The LMS algorithm is a stochastic gradient-based algorithm where the updated value of the filter weights 4,6 at time n+1 are computed using the recursive relations:

$$w_s(n+1)=w_s(n)+(½)\mu[-\partial J(n)/\partial w_s(n)] \quad \text{(Eq. 4A)}$$

$$w_c(n+1)=w_c(n)+(½)\mu[-\partial J(n)/\partial w_c(n)] \quad \text{(Eq. 4B)}$$

wherein:
$\mu$ is a positive step-size constant that controls the size of the incremental correction applied to the weight at each iteration;
J(n) is the squared-error signal at time n given by $J(n)=|I_F(n)|^2$; and
$\partial J(n)/\partial w_s(n)$ and $\partial J(n)/\partial w_c(n)$ are the partial derivatives of the squared-error signal J(n) with respect to the filter weight $w_s(n)$ and $w_c(n)$, respectively.

The update rule for the filter weight, $w_s$, is derived as follows. First, $I_F(n)$ 32 can be expressed using Equations 2 and 3 as follows:

$$I_F(n) = G_{ADC}(\omega_o)A\sin(\omega_o n+\theta_A+\theta_{ADC}(\omega_o)) - G_{ADC}(\omega_o)G_{DAC}(\omega_o)w_s(n)\sin(\omega_o n+\theta_{DAC}(\omega_o)+\theta_{ADC}(\omega_o)) - G_{ADC}(\omega_o)G_{DAC}(\omega_o)w_c(n)\cos(\omega_o n+\theta_{DAC}(\omega_o)+\theta_{ADC}(\omega_o))$$

wherein:
$G_{ADC}(\omega_o)$ and $\theta_{ADC}(\omega_o)$ are the respective magnitude and phase of the transfer function of ADC 10 at frequency $\omega=\omega_o$.

The partial derivative of J(n) with respect to $w_s(n)$ equals $$\frac{\partial J(n)}{\partial w_s(n)} = 2I_F(n)\left(\frac{\partial I_F(n)}{\partial w_s(n)}\right)$$

$$= -2I_F(n)G_{ADC}(\omega_o)G_{DAC}(\omega_o)\sin(\omega_o n + \theta_{DAC}(\omega_o) + \theta_{ADC}(\omega_o))$$

Therefore, the update rule for $w_s(n)$ 4 is given by Equation 5.

$$w_s(n+1)=w_s(n)+\mu G_{ADC}(\omega_o)G_{DAC}(\omega_o)I_F(n)\sin(\omega_o n+\theta_{DAC}(\omega_o)+\theta_{ADC}(\omega_o))) \quad \text{(Eq. 5)}$$

The weight update rule of Equation 5 is a version of the LMS algorithm that compensates for transfer functions present in the output path of the adaptive filter 2. A conventional Filtered-X LMS adaptive algorithm can be expressed as:

$$w_s(n+1)=w_s(n)+\mu I_F(n)xf_s(n)$$

wherein:

$xf_s(n)$ is equal to the filter input $x_s(n)$ 24 filtered by an estimate of the combined transfer function of DAC 20 and ADC 10.

In the frequency domain, $xf_s(\omega)$ is given by:

$$xf_s(\omega)=H(\omega)x_s(\omega),$$

wherein:

$H(\omega) \approx DAC(\omega)ADC(\omega),$ $DAC(\omega)$ is the transfer function of the DAC 20 in the frequency domain, and $ADC(\omega)$ is the transfer function of the ADC 10 in the frequency domain.

In a similar manner, the update rule for the second weight 6 is given by:

$$w_c(n+1)=w_c(n)+\mu I_F(n)xf_c(n)$$

wherein:

$$xf_c(\omega)=H(\omega)x_c(\omega).$$

The weight adaptation process is illustrated in FIG. 1. The disclosed concept can be applied to remove multiple frequencies by simply adding multiple instances of the left side of the filter 2 in FIG. 1. The application of this would be to remove the system frequency as well as some of the dominant harmonics. For example, for a power system (not shown), such a filter can remove the fundamental frequency (e.g., without limitation, 60 Hz) and, for example, the fifth harmonic (e.g., without limitation, 300 Hz) from the analog signal I(t) 16, which can be, for example, a power supply current.

Taking advantage of the uniform response of the transfer functions of the DAC 20 and the ADC 10, however, one can make an important simplification to the adaptation algorithm. Assuming that the DAC 20 and the ADC 10 have uniform gain and linear phase over the frequency band of interest or:

$$DAC(\omega) \approx G_{DAC}e^{-j\alpha\omega};$$

and $$ADC(\omega) \approx G_{ADC}e^{-j\beta\omega},$$

and creating a new step-size parameter, $\mu_c = \mu G_{ADC} G_{DAC}$, the update rule for $w_s(n)$ (Equation 5) can be simplified as:

$$w_s(n+1)=w_s(n)+\mu_c I_F(n)\sin(\omega_o(n-[\alpha+\beta])),$$

or $$w_s(n+1)=w_s(n)+\mu_c I_F(n)x_s(n-\Delta),$$

wherein:

$\Delta = \alpha + \beta$ represents the total delay through the ADC 10 and the DAC 20, and $\alpha$ and $\beta$ represent the delay through the DAC 20 and the ADC 10, respectively.

A similar update rule can be applied to $w_c(n)$ 6:

$$w_c(n+1)=w_c(n)+\mu_c I_F(n)x_c(n-\Delta).$$

Figure 2:
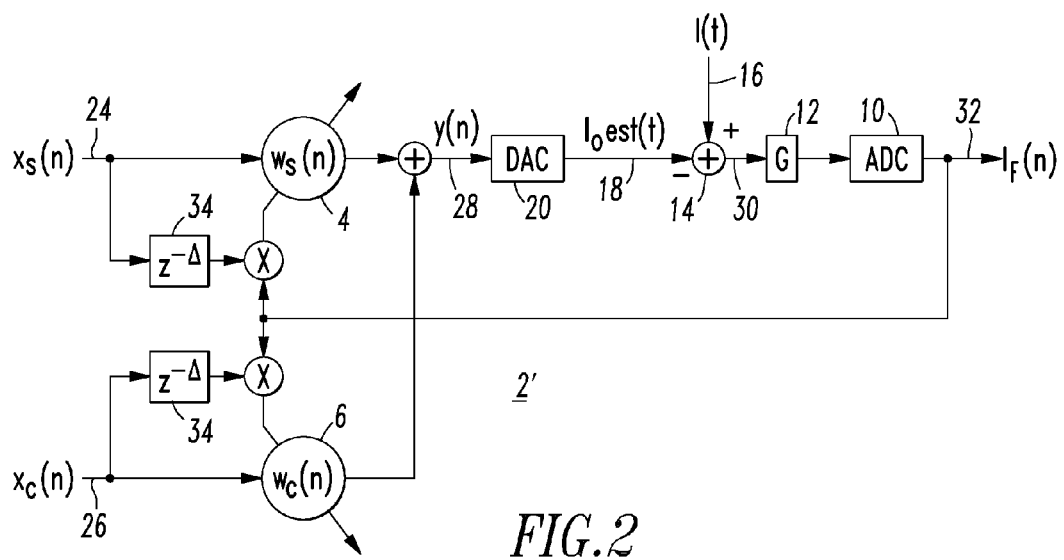
FIG. 2 is a block diagram of a simplified fundamental frequency cancellation filter in accordance with another embodiment of the disclosed concept.

The block diagram of a simplified adaptive filter 2' is shown in FIG. 2. The term $z^{-1}$ (not shown) represents a unit delay element. The symbol $z^{-\Delta}$ 34 of FIG. 2 represents a delay of $\Delta$ sample periods, as defined above, in the digital domain. This delay is a suitable digital model of the unknown H analog domain transfer function, which was discussed, above, in connection with FIG. 1.

The value of $\Delta$ can be determined using the frequency response specifications of the DAC 20 and the ADC 10. The theoretical range of the step-size parameter $\mu c$ resulting in the convergence of the algorithm to the optimum weights $w_s^*$ and $w_c^*$ is known and is given by:

$$0<\mu_c<4/(G_{DAC}G_{ADC})$$

FIG. 3 shows a system 40 including the adaptive filter 2 of FIG. 1 for canceling a fundamental frequency. The system 40 includes a first apparatus 42 including the first analog signal I(t) 16 having the fundamental frequency $\omega_o$, and a second apparatus 44 including an input 46 structured to input the first analog signal I(t) 16, an output 48 structured to output the second digital signal $I_F(n)$ 48, a processor, such as the example DSP 22, a routine, such as adaptive routine 50, executed by the example DSP 22, the DAC 20 having an input 52, an output 54 and the delay a between the input 52 and the output 54, and the ADC 10 having an input 56, an output 58 and the delay $\beta$ between the input 56 and the output 58.

The disclosed concept can be applied to a wide range of applications, such as for example and without limitation, the second apparatus 44 can be a fundamental frequency cancellation apparatus or a power sensing module for the first apparatus 42, which can be, for example and without limitation, a motor powered by a power line having a line frequency.

Although a technique for updating the adaptive weights 4,6 is disclosed, an alternative, known recursive least squares (RLS) algorithm can be employed.

Although a technique for the adaptive filter 2 is disclosed, this, alternatively, could also be implemented using a known Kalman filter.

Alternative estimation techniques for the unknown H analog domain transfer function (not shown) could also be employed. The disclosed concept simplifies the problem by modeling this transfer function with a simple delay line as was discussed, above, in connection with symbol $z^{-\Delta}$ 34 of FIG. 2, but other rational filter models can be employed.

The disclosed adaptive filters 2,2' can be employed, for example, to ensure that a motor current representation employed for motor current signature analysis is of suitable high fidelity. This is achieved by removing the fundamental frequency component of the example motor current (e.g., without limitation, motor current at 50 Hz; 60 Hz; 400 Hz; any suitable system frequency) and applying a suitable gain (G) 12 to the residual signal prior to the input 56 of the ADC 10 to minimize quantization error. Since this process is adaptive, relatively large and relatively small deviations from the nominal system frequency can be removed as well.

The disclosed adaptive filters 2,2' improve signal acquisition (e.g., increase resolution and/or decrease quantization noise) by nulling a fundamental line frequency component prior to analog to digital conversion for use in, for example, motor/load diagnostic applications. These adaptive filters 2,2' null out a single frequency (the fundamental component of the line frequency), track and null the fundamental component in the presence of small frequency changes (e.g., less than about 1 Hz) in applications where a load, such as a motor, is connected directly to a power line, and/or track and null the fundamental component in the presence of relatively large frequency changes (e.g., about 20 Hz to about 400 Hz) in applications where the motor is variable frequency AC drive (VFD) driven.

The disclosed concept provides efficient fundamental frequency cancellation filters 2,2' based on estimated frequency (e.g., estimated line frequency) $I_oest(t)$ 18 that can precisely cancel, for example, the line frequency from a supply current without corrupting the spectral content proximate that line frequency.

The disclosed concept can be employed in any motor or other load diagnostics or power quality assessment of an electrical system application, where it is advantageous to remove a single, dominant frequency component that obscures a number of signals of interest. In this manner, the example second apparatus 44 can readily provide known load diagnostics or known power quality assessment of the first powered apparatus 42 by making advantageous use of the second digital signal 32 ($I_F(n)$), which does not include a fundamental frequency component.

Although the DSP 22 and the example routine 50 are disclosed, the functions of the filters 2,2' can be implemented by a wide range of hardware and/or software components. For example and without limitation, the ADC 10 and the DAC 20 can be part of or separate from the DSP 22 or another suitable processor. Although the example routine 50 can provide the various signals 24,26,28, functions 8,12,14,34, and weights 4,6, those can be implemented by a wide range of hardware and/or software components.

For example, the disclosed concept can be applied to a motor wellness system. This provides the ability to increase the resolution of ADC conversion by eliminating the fundamental component of the line current and applying a gain to the residual signal (where the motor wellness information is contained) prior to analog to digital conversion. Also, the ability to track relatively small changes in the power supply frequency in directly connected systems or track relatively large frequency changes are of benefit when used with a VFD.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of canceling a fundamental frequency from an analog signal, said method comprising:
    inputting a first analog signal;
    outputting a second digital signal;
    employing a digital-to-analog converter comprising an input and an output;
    employing an analog-to-digital converter comprising an input and an output;
    inputting a third digital signal to and outputting a fourth analog signal representative of an estimate of a fundamental frequency component of the first analog signal from said digital-to-analog converter;
    inputting a fifth analog signal to said analog-to-digital converter and outputting from said analog-to-digital converter the second digital signal representative of the first analog signal with the fundamental frequency component removed;
    providing a first adaptive $w_s(n)$, and a second adaptive filter weight, $w_c(n)$;
    providing a first digital sine signal, $x_s(n)=\sin(\omega_o n)$, and a second digital cosine signal, $x_c(n)=\cos(\omega_o n)$;
    providing the third digital signal being $y(n)=w_s(n)*\sin(\omega_o n)+w_c(n)*\cos(\omega_o n)$;
    employing $\omega_o$ as frequency of the fundamental frequency component;
    employing n as an integer representative of a sample number;
    providing the fifth analog signal as a function of a difference between the first analog signal and the fourth analog signal;
    providing an optimum value of the first adaptive filter weight as being $w_s*=(A/G_{DAC}(\omega_o))\cos(\theta_A-\theta_{DAC}(\omega_o))$;
    providing an optimum value of the second adaptive filter weight as being $w_c=(A/DAC(\omega_o))\sin(\theta_A-\theta_{DAC}(\omega_o))$;
    employing $A=G_{DAC}(\omega_o)\sqrt{[(w_c*)^2+(w_s*)^2]}$;
    employing $\theta_A=\tan^{-1}(w_c*/w_s*)+\theta_{DAC}(\omega_o)$;
    employing $G_{DAC}(\omega_o)$ as magnitude of a transfer function of the digital-to-analog converter at the frequency of the fundamental frequency component; and
    employing $\theta_{DAC}(\omega_o)$ as phase of the transfer function of the digital-to-analog converter at the frequency of the fundamental frequency component.

2. The method of claim 1 further comprising:
    providing said function as being a gain value times said difference.

3. The method of claim 1 further comprising:
    updating the first and second adaptive weights employing a recursive least squares algorithm.

4. The method of claim 1 further comprising:
    modeling the transfer function employing a delay line.

5. The method of claim 1 further comprising:
    employing a motor current as said first analog signal; and
    employing a line frequency as the frequency of the fundamental frequency component.

6. A method of canceling a fundamental frequency from an analog signal, said method comprising:
    inputting a first analog signal;
    outputting a second digital signal;
    employing a digital-to-analog converter comprising an input and an output;
    employing an analog-to-digital converter comprising an input and an output;
    inputting a third digital signal to and outputting a fourth analog signal representative of an estimate of a fundamental frequency component of the first analog signal from said digital-to-analog converter;
    inputting a fifth analog signal to said analog-to-digital converter and outputting from said analog-to-digital converter the second digital signal representative of the first analog signal with the fundamental frequency component removed;
    providing a first adaptive filter weight, $w_s(n)$, and a second adaptive filter weight, $w_c(n)$;
    providing a first digital sine signal, $x_s(n)=\sin(\omega_o n)$, and a second digital cosine signal, $x_c(n)=\cos(\omega_o n)$;
    providing the third digital signal being $y(n)=w_s(n)*\sin(\omega_o n)+w_c(n)*\cos(\omega_o n)$;

employing $\omega_o$ as frequency of the fundamental frequency component;

employing n as an integer representative of a sample number;

providing the fifth analog signal as a function of a difference between the first analog signal and the fourth analog signal;

determining the first adaptive filter weight, $w_s(n)$, as being equal to $w_s(n-1)+\mu G_{ADC}(\omega_o)G_{DAC}(\omega_o)I_F(n-1)\sin(\omega_o(n-1)+\theta_{DAC}(\omega_o)+\theta_{ADC}(\omega_o))$;

determining the second adaptive filter weight, $w_c(n)$, as being equal to $w_c(n-1)+\mu G_{ADC}(\omega_o)G_{DAC}(\omega_o)I_F(n-1)\sin(\omega_o(n-1)+\theta_{DAC}(\omega_o)+\theta_{ADC}(\omega_o))$;

employing $G_{DAC}(\omega_o)$ as gain of said digital-to-analog converter versus the frequency of the fundamental frequency component;

employing $G_{ADC}(\omega_o)$ as gain of said analog-to-digital converter versus the frequency of the fundamental frequency component;

employing $\theta_{DAC}(\omega_o)$ as phase of said digital-to-analog converter versus the frequency of the fundamental frequency component;

employing $\theta_{ADC}(\omega_o)$ as phase of said analog-to-digital converter versus the frequency of the fundamental frequency component; and employing $\mu$ as a positive constant.

7. A method of canceling a fundamental frequency from an analog signal, said method comprising:

inputting a first analog signal;

outputting a second digital signal;

employing a digital-to-analog converter comprising an input and an output;

employing an analog-to-digital converter comprising an input and an output;

inputting a third digital signal to and outputting a fourth analog signal representative of an estimate of a fundamental frequency component of the first analog signal from said digital-to-analog converter;

inputting a fifth analog signal to said analog-to-digital converter and outputting from said analog-to-digital converter the second digital signal representative of the first analog signal with the fundamental frequency component removed;

providing a first adaptive filter weight, $w_s(n)$, and a second adaptive filter weight, $w_c(n)$;

providing a first digital sine signal, $x_s(n)=\sin(\omega_o n)$, and a second digital cosine signal, $x_c(n)=\cos(\omega_o n)$;

providing the third digital signal being $y(n)=w_s(n)*\sin(\omega_o n)+w_c(n)*\cos(\omega_o n)$;

employing $\omega_o$ as frequency of the fundamental frequency component;

employing n as an integer representative of a sample number;

providing the fifth analog signal as a function of a difference between the first analog signal and the fourth analog signal;

employing $DAC(\omega)$ as a transfer function of the digital-to-analog converter as a function of frequency, $\omega$, of the fundamental frequency component;

employing $ADC(\omega)$ as a transfer function of the analog-to-digital converter as a function of the frequency of the fundamental frequency component;

employing said digital-to-analog converter and said analog-to-digital converter having a uniform gain and a linear phase over a predetermined range of frequencies;

setting $DAC(\omega)=G_{DAC}e^{-j\alpha\omega}$;

setting $ADC(\omega)=G_{ADC}e^{-j\beta\omega}$;

employing $G_{DAC}$ as the uniform gain of said digital-to-analog converter;

employing $G_{ADC}$ as the uniform gain of said analog-to-digital converter;

employing $\alpha$ as a delay between the input and the output of the digital-to-analog converter;

employing $\beta$ as a delay between the input and the output of the analog-to-digital converter;

employing $\mu$ as a positive constant;

employing $\mu_c = \mu G_{ADC} G_{DAC}$;

providing $w_s(n)=w_s(n-1)+\mu_c I_F(n-1)x_s(n-\Delta-1)$; and providing $w_c(n)=w_c(n-1)+\mu_c I_F(n-1)x_c(n-\Delta-1)$.

8. The method of claim 7 further comprising:

providing the first adaptive filter weight, $w_s(n)$, being equal to $w_s(n-1)+\mu_c I_F(n-1)x_c(n-\Delta-1)$;

providing the second adaptive filter weight, $w_c(n)$, being equal to $w_c(n-1)+\mu_c I_F(n-1)x_c(n-\Delta-1)$;

employing $\mu_c$ as a positive constant;

employing $I_F(n-1)$ as the second digital signal for the sample number being n−1;

employing $x_s(n-\Delta-1)=\sin(\omega_o(n-\Delta-1))$;

employing $x_c(n-\Delta-1)=\cos(\omega_o(n-\Delta-1))$;

employing $\Delta$ as a sum of a delay between the input and the output of the digital-to-analog converter and a delay between the input and the output of the analog-to-digital converter; and providing the fifth analog signal as a function of a difference between the first analog signal and the fourth analog signal.

* * * * *